(12) United States Patent
Peng et al.

(10) Patent No.: US 11,764,088 B2
(45) Date of Patent: Sep. 19, 2023

(54) METHOD FOR TESTING A STANDARD INTERFACE AND INTERFACE-TESTER

(71) Applicants: CHINA TRIUMPH INTERNATIONAL ENGINEERING CO., LTD., Shanghai (CN); CTF SOLAR GMBH, Dresden (DE)

(72) Inventors: Shou Peng, Shanghai (CN); Xinjian Yin, Shanghai (CN); Ganhua Fu, Leipzig (DE); Zhizhong Liao, Dresden (DE); Marcel Mischke, Dresden (DE); Michael Harr, Ruppertshain (DE); Bastian Siepchen, Dresden (DE)

(73) Assignees: CHINA TRIUMPH INTERNATIONAL ENGINEERING CO., LTD., Shanghai (CN); CTF SOLAR GMBH, Dresden (DE)

( * ) Notice: Subject to any disclaimer, the term of this patent is extended or adjusted under 35 U.S.C. 154(b) by 0 days.

(21) Appl. No.: 17/909,369

(22) PCT Filed: Mar. 4, 2020

(86) PCT No.: PCT/CN2020/077694
§ 371 (c)(1),
(2) Date: Sep. 3, 2022

(87) PCT Pub. No.: WO2021/174433
PCT Pub. Date: Sep. 10, 2021

(65) Prior Publication Data
US 2023/0093560 A1 Mar. 23, 2023

(51) Int. Cl.
*G05B 19/418* (2006.01)
*H01L 21/67* (2006.01)
*H01L 31/18* (2006.01)

(52) U.S. Cl.
CPC .. *H01L 21/67276* (2013.01); *G05B 19/41875* (2013.01); *H01L 31/188* (2013.01); *G05B 2219/32368* (2013.01)

(58) Field of Classification Search
CPC .... G05B 19/41875; G05B 2219/32368; H01L 21/67276; H01L 31/188; H02S 50/10; Y02E 10/50
See application file for complete search history.

(56) References Cited

U.S. PATENT DOCUMENTS 6,223,098 B1 * 4/2001 Cheong .............. G01R 31/2894
700/109
6,823,280 B2 * 11/2004 Brayton .............. G06F 11/261
702/108

(Continued)

FOREIGN PATENT DOCUMENTS

| CN | 202494702 U | 10/2012 |
| CN | 103235270 A | 8/2013 |
| KR | 20150045871 A | 4/2015 |

*Primary Examiner* — Kidest Bahta
(74) *Attorney, Agent, or Firm* — Global IP Services; Tianhua Gu

(57) ABSTRACT

The subject of this invention is a method for testing the data and control interface of individual machines intended for interconnection in an inline system for solar cell production. Furthermore, an Interface-Tester suitable for executing the testing method is disclosed. The method for testing comprises the steps of feeding a dummy workpiece to the tested machine and connecting the interface tester to the standard interface of the machine. Consecutively the interface tester sends controlling signals to the machine and receives the signals from the tested machine. The received signals are compared to reference signals and evaluated. The interface tester comprises a standard interface for coupling the machines in an inline system for solar cell production. Furthermore, the interface tester is equipped with at least (Continued)

Figure 1:
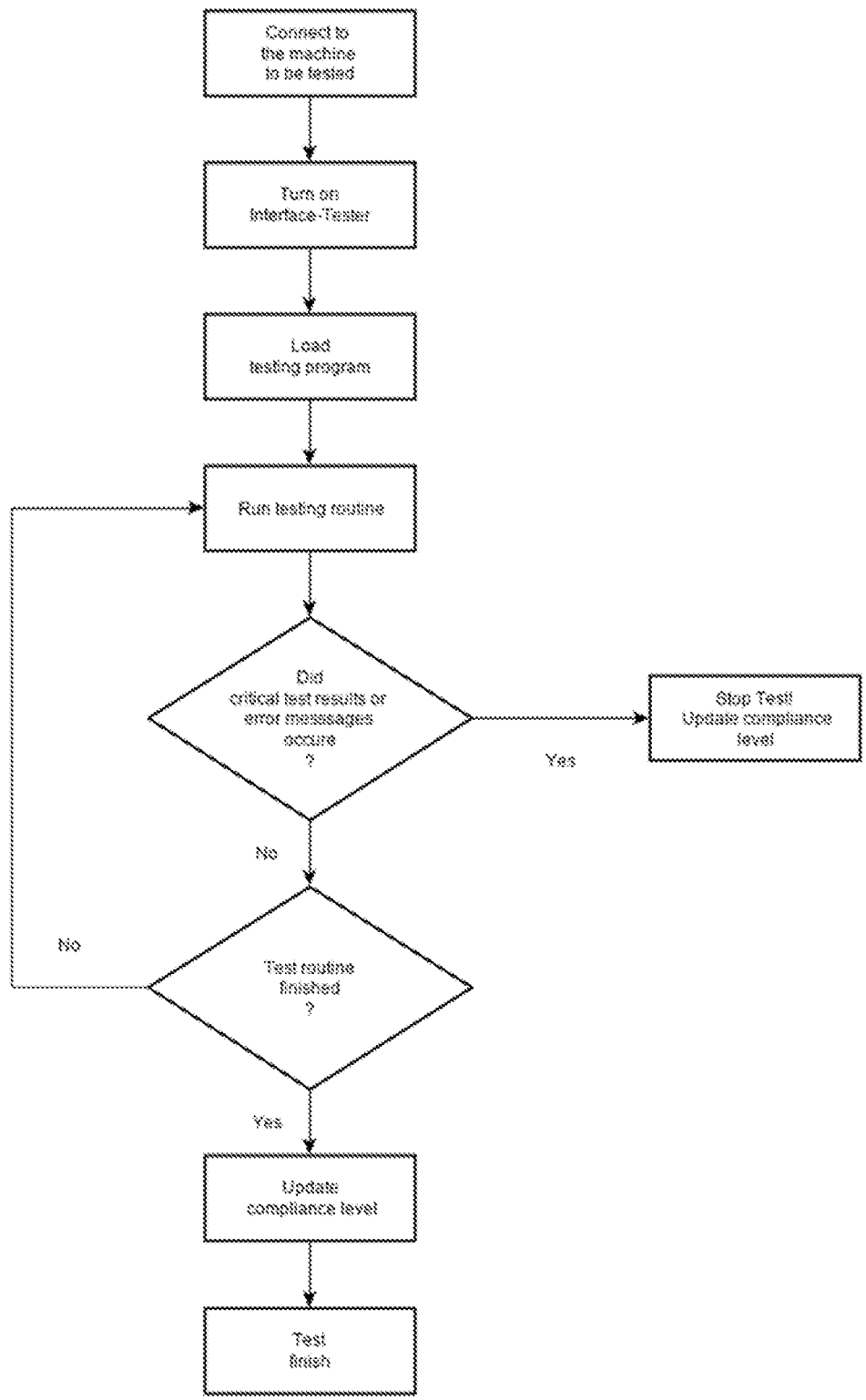

one CPU, a volatile and/or non-volatile memory, communication modules, couplers and connectors and at least one human-machine interface.

10 Claims, 3 Drawing Sheets

(56) References Cited

U.S. PATENT DOCUMENTS

| | | | | |
|---|---|---|---|---|
| 8,633,482 B2 * | 1/2014 | Walter | ............... | H01L 22/34 |
| | | | | 257/E23.149 |
| 2019/0384685 A1 * | 12/2019 | Furihata | ............ | G05B 23/02 |

* cited by examiner

METHOD FOR TESTING A STANDARD INTERFACE AND INTERFACE-TESTER

The subject of this invention is a method for testing the data and control interface of individual machines intended for interconnection in an inline system for solar cell production. Furthermore, an Interface-Tester suitable for executing the testing method is disclosed.

Modern inline systems for solar cell production provide the transport of solar cell wafers through a multitude of different machines (tools), whereby one or more processing steps of solar cell production are carried out in each tool. The machines are connected to each other by a transport system and often by a common vacuum system or intermediate vacuum locks.

The individual tools are often produced by different machine manufacturers and are assembled and connected at the installation site of the inline system. The data processing interaction of the individual tools is usually carried out via standard interfaces using fieldbus protocols.

After setting up and connecting the tools, the system is tested. This applies both to the communication between the tools and to the control of the transport and processing of the solar cell wafers. It has proven to be disadvantageous if malfunctions are only detected on the individual tools during interconnection or testing of the entire inline system.

A large number of methods for testing machine systems are known. Subject matter of U.S. Pat. No. 6,823,280B2 is a test system for control systems of a factory. The test system is connected to the network of the control system. A database is stored in the test system which contains the requirements for the individual subsystems of the control system. A comparison of the requirements stored in the database with the return values of the subsystems is provided. The database can also be used to generate test procedures.

US 2004/0193396 A1 describes a procedure for testing configuration programs for fieldbus components. The configuration program is used to configure the slaves in the fieldbus network. It defines the addresses, data and protocols in the network. The configuration program runs in an execution form on a PLC (Programmable Logic Controller—a CPU for industrial applications). Simulated input data is sent to the configuration program for testing, and the output data can be compared and evaluated with predefined expected values. Master-slave configurations are provided.

EP 0 929 855 B1 describes a portable maintenance device which is suitable both for testing the power supply of a device in a process control system and also for testing the communication with this device. For this purpose, control signals are generated and the associated response signals evaluated. In particular, it is determined whether the quality of the exchanged signals meets the requirements. The application is described in particular for fieldbus networks.

WO 2016/091 838 A1 describes a procedure for checking the expected temperature curve during the contacting of solar cells. A dummy wafer with at least one temperature sensor and a storage device that records the temperature curve is processed for this purpose. The subsequent evaluation allows the evaluation of whether the temperature curve is acceptable. The use of a control device is also proposed, which can be used to evaluate the values and correct the heating control as a function of the measured temperature values.

None of the state-of-the-art procedures supports testing of different machines for inline systems before this inline system is assembled from the different machines. In addition, known machine test systems examine the protocols, but do not offer parallel function tests with workpieces. The task is therefore to be able to fully test machines (tools) that are intended for interconnection in an inline system for solar cell production before they are assembled, preferably at the manufacturers site. Furthermore, an Interface-Tester for testing the standard Interface needs to be described.

According to the present invention, the task is solved with the method according to claim 1. Advantageous further procedural methods according to the invention are disclosed in the subclaims referred back.

The procedure according to the invention for testing a machine of solar cell production, which comprises at least one standard interface for coupling the machines in an inline system for solar cell production, before the inline system is assembled, provides at least the steps of:

feeding one or more dummy workpieces or a carrier with one or more dummy workpieces to the tested machine, connecting a programmable interface tester to the standard interface or interfaces of the tested machine, wherein the programmable interface tester is set up:

to generate the signals generated by the machine upstream of the machine to be tested in the inline system, to generate control signals that control the machining process of the machine under test, to store the mentioned signals and control signals in the course of programming the interface tester and to generate them as required, to receive, store and evaluate signals of the machine to be tested, to store reference signals for the machine under test, performing the intended operations on one or more dummy workpieces by the machine to be tested, wherein the interface tester, according to its programming:

sends the signals of the upstream machine in the inline system to be set up to the machine to be tested, sends control signals to the machine to be tested to control its operation, receives signals from the machine under test via the standard interface, compares the received signals with the reference signals stored in the interface tester, wherein the comparison of received signals and reference signals indicates the correct or faulty functioning of the machine, issues at least the result of this conclusion.

According to the invention, evaluation of correctness at the application level is the subject of testing with the interface tester. The application level is the protocol level at which machine and/or process specific (application specific) signals and control signals are exchanged. It is examined whether the correct response signals are generated for signals and control signals which reach the machine via the standard interface or whether the machine executes the expected work and transport processes.

The programmable interface tester is also preferably set up to test the standard interface of the machine to be tested at different protocol levels. Optionally, the existence of a physical connection is tested on a lower level, optionally the compliance with level or time specifications within the protocol definition is tested on a higher level, and optionally the feasibility and correctness of handshake signals are tested on a higher level above.

Status messages of the machine are regarded as signals. These are e.g. handshake signals and other status signals (e.g. readiness for data transmission, start and end of work), measured values recorded in the machine, position data of the wafer or the wafer carrier and the transport system, etc. Control signals are signals that control the work and transport processes in the machine and the transport system. The advantage is that deviations in the implementation of the bus protocols are detected, since the same tester (or different testers with the same software) tests several or all machines intended for an inline system with a fixed implementation of the respective bus protocol.

Preferably, the interface tester is also suitable for testing the correct interaction of the transport system with the respective machine. Both the control of the machines and the transport device are carried out via microcontrollers (programmable logic controller—PLC). The interface tester generates control signals for the section of the transport system that is part of the machine under test as well as for the machining functionality of the machine, applies the transport and machining operations to the dummy workpiece(s) and checks the response signals and measured values of the machine for correctness. In particular, it is tested whether the transport processes in the machine are correctly synchronized with the machining processes in terms of time and/or location.

The machines to be tested are preferably coating machines (PECVD systems), cleaning systems, wet chemical treatment systems, temperature treatment systems (furnaces), laser cutting or contact burn-in systems etc. In principle, the test procedure can be used on any machine of an inline system, assumed it is integrated in the data network of the inline system.

In particular, the interface tester is set up to generate the signals of the machine to be tested seen in the direction of travel, upstream of the machine to be tested. Typical for inline systems is a design in which the upstream machine emits signals and control signals to the downstream machine, but receives none or only a few signals from it (e.g. only "wafer transfer completed" or similar).

For the first machine in an inline system, seen in the direction of throughput of the workpieces, the readiness signals of the transport device, that the workpiece or the carrier with workpieces has been provided, are to be regarded as signals of the upstream machine.

The machines to be tested are equipped with their own data processing devices that control and monitor the working and transport processes of the machine under program control. Optional sensors and/or actuators are assigned to the data processing devices for this purpose. The data processing devices of the machines are usually designed as PLCs and, after installation of the machine in the inline system, are connected to each other and to the central control device (also a data processing device) via a network, often a master-slave network. The network is a state-of-the-art design.

The dummy workpieces used are preferably spare workpieces on which the operations carried out by the machine under test can be carried out, whereby the dummy workpieces react analogously to the real workpieces. In particular, the dummy workpieces have identical geometrical dimensions as the original workpieces. In addition, the dummy workpieces do not release any material or deform only slightly during machining. Solar cell wafers that have been rejected are particularly suitable as dummy workpieces. If carriers are used for the dummy workpieces, they are preferably carriers as they are used in the real production process. Dummy workpieces or carriers with dummy workpieces can be fed to the machine under test by means of an auxiliary construction or manually in the absence of a continuous or upstream transport system.

The interface tester is designed as a preferably portable hardware construction. It has at least one CPU, preferably in the form of a PLC (Programmable Logic Controller—Microcontroller). The interface tester is therefore freely programmable. In addition, memories (volatile and/or non-volatile), communication modules, couplers and connectors are included in the interface tester. Furthermore, at least one human-machine interface (HMI) is preferred, especially in the form of a display and a keyboard. However, output via a printing device is also possible as an option. The couplers and connectors are adapted to the bus system of the machine to be tested or to the corresponding (mostly standardized) connectors. A preferred version is a "Profibus" system. Couplers and connectors are accordingly designated as for "DP". (Distributed Peripherals) are executed appropriately. In networks with a master-slave topology, the interface tester can act both as a master and as a slave in a specific embodiment.

In particular, the interface tester has at least one standard interface via which it can be connected to the standard interface of the machine to be tested.

The Interface Tester preferably comprises at least one additional interface that allows connection to state-of-the-art computer systems. This is, for example, a USB, Ethernet or serial interface. This additional interface advantageously allows the transfer of program code and database entries to the preferably non-volatile part of the interface tester's memory.

The programming of the interface tester as well as the data transfer to it is carried out in a particularly simple embodiment by means of the standard interface, which is also used for connection to the machine to be tested.

The program code contains the test routines to be performed. These test routines as well as the signals and control signals to be sent to the machine to be tested, reference values of the response signals expected from the machine to be tested, permissible tolerances and other information required for the test sequence can also be stored in the interface tester and selected or called up as required or under program control. Preferably, the mentioned values are stored as a database in the interface tester.

In particular, the interface tester is suitable for testing different machines. Thus, the machine to be tested can be selected preferentially at the user interface. The data and programs belonging to this machine are then loaded from the internal data memory into the working memory assigned to the PLC. A database can be optionally available internally for this purpose. If different configurations are possible in the inline system, the machine upstream of the machine to be tested can also be selected as an option. This ensures that the signals and control signals to be expected in real operation are fed to the machine to be tested and that the reaction of the machine to be tested to the signals and control signals is checked.

The functionality for testing the protocol levels below the application level corresponds to that of well-known state-of-the-art testers. At the application level, however, machine and process specific commands have been stipulated which cannot be tested with commercially available testers. The interface tester, which is used in the procedure according to the invention, can test advantageously on the application level or on the application level and optionally on lower protocol levels.

Since the corresponding data for each machine to be tested is stored in a database, the interface tester can be adapted very quickly to the respective test task by loading the test routines and the signals, control signals, reference values, etc. from the database and processing the test routines. The test routines are test steps that test the functionality of the machine or transport system to be tested. During the execution of the test routines, the transport and work processes on the dummy workpiece(s) are carried out by the machine to be tested. The interface tester thus tests the machine and/or the transport system. The test of both the machine and the transport system is preferred. During the test, signals (return signals) are generated by the machine to be tested and/or the transport system, which document the test progress and test results. These return signals are received in the interface tester and compared with reference values. The result of this comparison is an evaluation. This evaluation indicates whether the machine is operating within the permitted tolerances or not. In addition, the degree of deviation can be specified as an option.

Optionally, the signals emitted by the machine under test are recorded by the interface tester (log file). Furthermore, it can optionally record the entire test including the transmitted signals and control signals as well as the received signals and their timing and evaluation. Optionally, the log level, i.e. the amount of data to be recorded during the test, is adjustable. Optionally, also the test data can be recorded in a database. Optionally, the recorded data can subsequently be transferred to other data processing devices and evaluated there. The evaluation results are preferably shown on the display or another human-machine interface of the interface tester or signaled in another way (e.g. acoustically). The evaluation result can be classified as a compliance level for the machine tested. Furthermore, the current test progress (the current test step) as well as the results of the test steps already performed can be optionally displayed. Other information relevant for test execution can also be displayed optionally or on request or transmitted in any other way.

The evaluation of whether the machine is operating within the permissible tolerance can be shown on the user interface, preferably on a display. Optionally, an inadmissible deviation can lead to the termination of the test program. Furthermore, if the test program is terminated in this way, the interface tester can optionally cause the dummy workpieces or the carrier with dummy workpieces to be ejected or otherwise output from the machine by sending the corresponding control signals. Whether the test program is to be terminated or which steps (e.g. ejection) are to be carried out if a permissible or impermissible deviation is present can optionally be stored in the database of the interface tester.

The invention is not limited to the represented and described forms of processing, but also includes all forms of processing which have the same effect in the sense of the invention. Furthermore, the invention is not limited to the specially described combinations of features, but can also be defined by any other combination of certain features of all the individual features disclosed as a whole, provided that the individual features are not mutually exclusive, or a specific combination of individual features is not explicitly excluded.

DRAWINGS

FIG. 1 shows the test procedure schematically. Only the most important steps are depicted.

Figure 2:
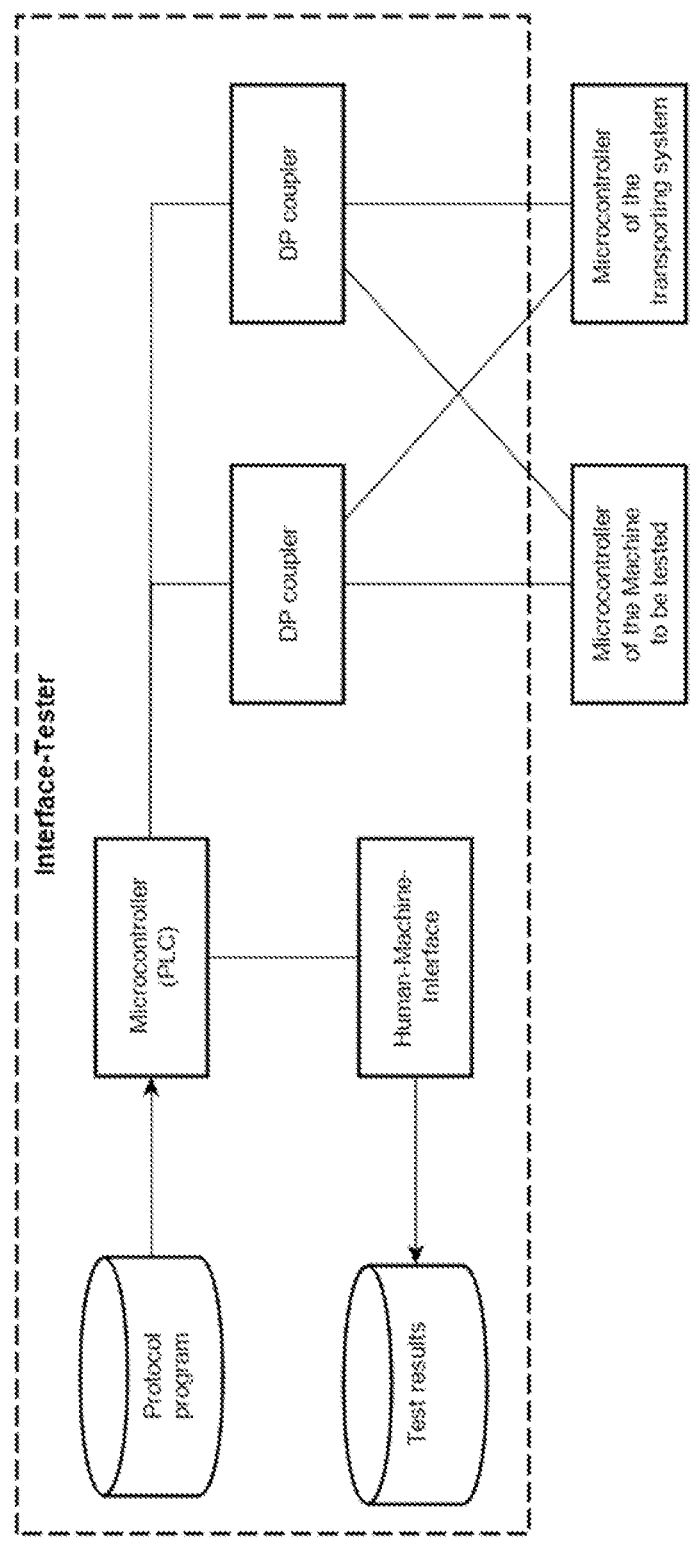

FIG. 2 schematically shows the coupling of the interface tester to the machine to be tested and the transport system. The dotted lines indicate which components are part of the interface tester.

Figure 3:
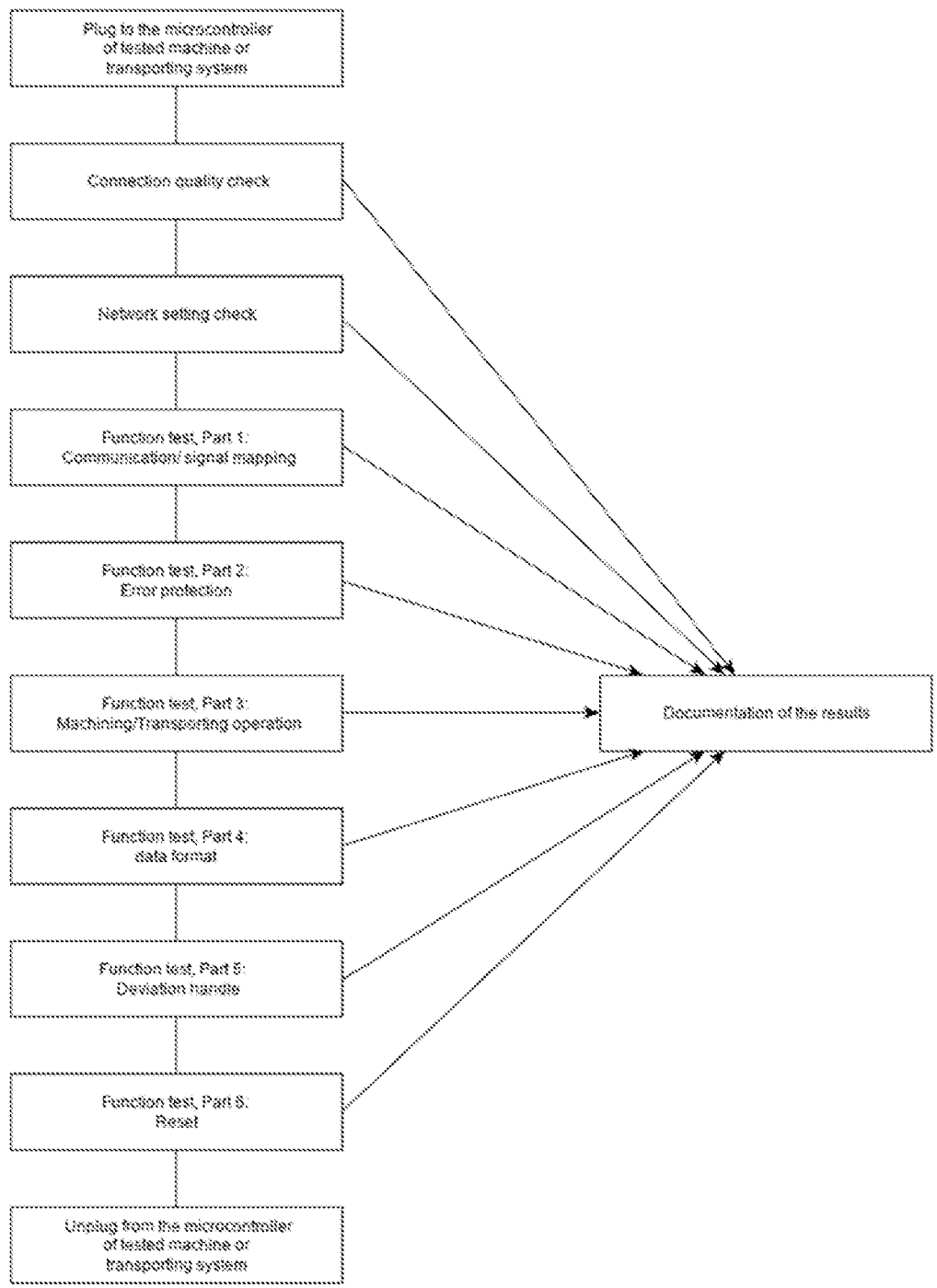

FIG. 3 shows schematically a test procedure in more detail. In this embodiment the test result of every single testing step is documented. In other embodiments it is possible to show a summarized test result at the end of the tests. Both versions are also possible.

EXEMPLARY EMBODIMENT

The interface tester has a type Siemens 1212C AC/DC/RLY microcontroller. 75 KB RAM and 2 MB non-volatile flash memory are assigned to this microcontroller. Furthermore, a display with 800×480 pixels and an alphanumeric keyboard are provided. The microcontroller communicates via Siemens DP/DP coupler modules with a state-of-the-art PROFIBUS interface.

In the non-volatile memory of the interface tester, the test sequence as a sequence of program steps and the associated signals and control signals to be transmitted are stored in a database for each machine to be tested. In addition, the database contains the expected return signals of the machine to be tested and, if applicable, tolerance values of the return signals for the respective machine to be tested, and optionally action specifications (as a sequence of program steps) in the event that the return signals lie outside the tolerance values or are faulty or absent.

The test sequence presumes that the machine to be tested is provided with dummy workpieces or a carrier with dummy workpieces. The interface tester is connected to the machine to be tested via the standard interface and switched on. After the start process, the interface tester offers the selection of the test item, i.e. the selection of the machine to be tested from the database. With the selection of the machine to be tested, the information belonging to this machine is loaded from the database. The test sequence (program), the signals and control signals to be sent, etc. are taken from the database and transferred to the microcontroller for processing. The microcontroller sends the signals and control signals via the standard interface to the machine under test or to the transport system. The transport system moves the dummy workpieces to the machining position. The transport system then sends a finished message to the interface tester. The interface tester compares whether the finished signal has arrived within the specified time. The interface tester takes the scheduled time as well as the other reference values from the internal database. If the time is exceeded, there is a deviation that is not critical. A test termination is therefore not necessary. The deviation is noted in the log file and the test is continued. The simulated processing of the dummy workpieces in the machine to be tested now begins. To do this, the interface tester sends the corresponding start signals. The return signals generated during machining of the machine to be tested are again compared with the expected return signals (reference values). The test sequence is controlled by the interface tester on the basis of the permissible deviations (tolerances) taken from the database and the planned further steps also stored in the database in the event of a permissible or impermissible deviation. The test progress and the evaluations of the individual test steps are shown on the interface tester display.

At the end of the test, an overall result is displayed. The evaluations of the individual test steps can be taken from the log file or the log file can be transferred to a data processing system for further evaluation. For this purpose, the interface tester is connected to a PC via wireless interface.

The invention claimed is:

1. Method for testing a machine of solar cell production, which comprises at least one standard interface for coupling the machines in an inline system for solar cell production, before the inline system is assembled, executing at least the steps of:
    feeding one or more dummy workpieces or a carrier with one or more dummy workpieces to the tested machine,
    connecting a programmable interface tester to the standard interface or interfaces of the tested machine, wherein the programmable interface tester is set up:
        to generate the signals generated by the machine upstream of the machine to be tested in the inline system,
        to generate control signals that control the machining process of the machine under test,
        to store the mentioned signals and control signals in the course of programming the interface tester and to generate them as required,
        to receive, store and evaluate signals of the machine to be tested,
        to store reference signals for the machine under test,
    performing the intended operations on one or more dummy workpieces by the machine to be tested,
    performing the following steps by the interface tester according to its programming:
        sending the signals of the upstream machine in the inline system to be set up to the machine to be tested,
        sending control signals to the machine to be tested to control the operations,
        receiving signals from the machine under test via the standard interface,
        comparing the received signals with the reference signals stored in the interface tester, wherein the comparison of received signals and reference signals indicates the correct or faulty functioning of the machine,
        issuing at least the result of this conclusion.

2. Method according to claim 1, characterized in that the dummy workpieces or carriers with dummy workpieces are fed to the machine to be tested in the absence of a continuous or upstream transport system by means of an auxiliary construction or manually.

3. Method according to claim 1, characterized in that the signals, control signals, reference values of the response signals expected by the machine to be tested, permissible tolerances and further information necessary for the test sequence are stored in at least one database in the interface tester.

4. Method according to claim 3, characterized in that the database further contains the steps to be taken in the event of an inadmissible discrepancy.

5. Method according to claim 1, characterized in that the result of the comparison of received signals and reference signals is issued on a display of the interface tester.

6. Method according to claim 1, characterized in that the test sequence and the results of the test steps are recorded at an adjustable log level in the interface tester.

7. Method according to claim 1, characterized in that the comparison of signals and reference signals also includes the correctness of protocol levels below the application level.

8. Method according to claim 1, characterized in that the interface tester acts in a programmable manner as master or as a slave with respect to the machine to be tested.

9. Interface tester for performing the method according to claim 1, comprising: at least one CPU, a volatile and/or non-volatile memory, communication modules, couplers and connectors, at least one standard interface suitable for coupling to the machine under test, and at least one human-machine interface.

10. Interface tester according to claim 9, characterized in that the interface tester has at least one further interface for coupling to a network or a data processing system, this interface being, for example, a USB or Ethernet interface.

* * * * *